(12) United States Patent
Jeong et al.

(10) Patent No.: US 8,610,149 B2
(45) Date of Patent: Dec. 17, 2013

(54) ORGANIC LIGHT EMITTING DIODE DISPLAY

(75) Inventors: Hee-Seong Jeong, Yongin (KR); Sung-Soo Koh, Yongin (KR); Tae-Gon Kim, Yongin (KR); Seung-Yeon Cho, Yongin (KR); Chul-Woo Jeong, Yongin (KR); Jae-Yong Kim, Yongin (KR); Chi-Wook An, Yongin (KR); Moo-Soon Ko, Yongin (KR); Ok-Byoung Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 245 days.

(21) Appl. No.: 12/964,526

(22) Filed: Dec. 9, 2010

(65) Prior Publication Data

US 2011/0140090 A1 Jun. 16, 2011

(30) Foreign Application Priority Data

Dec. 10, 2009 (KR) .................. 10-2009-0122577

(51) Int. Cl.
*H01L 33/00* (2010.01)
(52) U.S. Cl.
USPC 257/98; 257/436; 257/E51.021; 257/E51.022

(58) Field of Classification Search
USPC .............. 257/40, 98, 436, E51.018, E51.022
See application file for complete search history.

(56) References Cited

U.S. PATENT DOCUMENTS

| 2004/0183975 | A1* | 9/2004 | Yamaguchi et al. | 349/137 |
| 2006/0175965 | A1 | 8/2006 | Lim | |
| 2010/0013383 | A1* | 1/2010 | Kim et al. | 313/504 |

FOREIGN PATENT DOCUMENTS

| JP | 2007299729 A | 11/2007 |
| JP | 2008027722 A | 2/2008 |
| KR | 100683693 B1 | 2/2007 |
| KR | 1020070092079 A | 9/2007 |
| KR | 1020090046240 A | 5/2009 |

* cited by examiner

*Primary Examiner* — James Mitchell
*Assistant Examiner* — Colleen E Snow
(74) *Attorney, Agent, or Firm* — Knobbe Martens Olson & Bear LLP

(57) ABSTRACT

An organic light emitting diode display is disclosed. The display includes: a substrate; a first electrode positioned on the substrate; an organic emission layer positioned on the first electrode; a second electrode positioned on the organic emission layer; and a semi-transmissive layer positioned between the substrate and the first electrode and having a plurality of refractive layers having different refractive indices.

18 Claims, 21 Drawing Sheets

FIG.6

| Device color characteristics | | | |
|---|---|---|---|
| Color | | Comparative Example | First Experimental Example |
| Blue | (x,y) | (0.132, 0.139) | (0.146, 0.093) |
| | Efficiency(%) | 100 | 62.7 (↓) |
| Green | (x,y) | (0.297, 0.641) | (0.231, 0.700) |
| | Efficiency(%) | 100 | 104.6 |
| Red | (x,y) | (0.663, 0.335) | (0.676, 0.322) |
| | Efficiency(%) | 100 | 133.6 |
| Color reproduction | | 74% | 95.6% |

FIG.9

| Device color characteristics | | | |
|---|---|---|---|
| Color | | Comparative Example | Second Experimental Example |
| Blue | (x,y) | (0.132, 0.139) | (0.157, 0.074) |
| | Efficiency(%) | 100 | 45.9 (↓) |
| Green | (x,y) | (0.297, 0.641) | (0.201, 0.723) |
| | Efficiency(%) | 100 | 114.0 |
| Red | (x,y) | (0.663, 0.335) | (0.671, 0.323) |
| | Efficiency(%) | 100 | 138.2 |
| Color reproduction | | 74% | 102.0% |

FIG.12

| Device color characteristics | | | |
|---|---|---|---|
| Color | | Comparative Example | Third Experimental Example |
| Blue | (x,y) | (0.132, 0.139) | (0.146, 0.093) |
| | Efficiency(%) | 100 | 62.7 (↓) |
| Green | (x,y) | (0.297, 0.641) | (0.228, 0.690) |
| | Efficiency(%) | 100 | 119.0 |
| Red | (x,y) | (0.663, 0.335) | (0.676, 0.322) |
| | Efficiency(%) | 100 | 133.6 |
| Color reproduction | | 74% | 94.1% |

FIG.15

| Device color characteristics ||  |  |
|---|---|---|---|
| Color || Comparative Example | Fourth Experimental Example |
| Blue | (x,y) | (0.132, 0.139) | (0.157, 0.074) |
|  | Efficiency(%) | 100 | 45.9 (↓) |
| Green | (x,y) | (0.297, 0.641) | (0.200, 0.725) |
|  | Efficiency(%) | 100 | 132.9 |
| Red | (x,y) | (0.663, 0.335) | (0.671, 0.323) |
|  | Efficiency(%) | 100 | 138.2 |
| Color reproduction || 74% | 102.4% |

FIG.18

| Device color characteristics | | | |
|---|---|---|---|
| Color | | Comparative Example | Fifth Experimental Example |
| Blue | (x,y) | (0.132, 0.139) | (0.146, 0.093) |
| | Efficiency(%) | 100 | 62.7 (↓) |
| Green | (x,y) | (0.297, 0.641) | (0.242, 0.694) |
| | Efficiency(%) | 100 | 117.9 |
| Red | (x,y) | (0.663, 0.335) | (0.676, 0.322) |
| | Efficiency(%) | 100 | 133.6 |
| Color reproduction | | 74% | 93.7% |

FIG.21

| Device color characteristics ||  |  |
|---|---|---|---|
| Color || Comparative Example | Sixth Experimental Example |
| Blue | (x,y) | (0.132, 0.139) | (0.146, 0.093) |
|  | Efficiency(%) | 100 | 62.7 (↓) |
| Green | (x,y) | (0.297, 0.641) | (0.242, 0.694) |
|  | Efficiency(%) | 100 | 117.9 |
| Red | (x,y) | (0.663, 0.335) | (0.672, 0.325) |
|  | Efficiency(%) | 100 | 153.4 |
| Color reproduction || 74% | 92.9% |

ORGANIC LIGHT EMITTING DIODE DISPLAY

CROSS-REFERENCE TO RELATED APPLICATIONS

This application claims priority to and the benefit of Korean Patent Application No. 10-2009-0122577 filed in the Korean Intellectual Property Office on Dec. 10, 2009, the entire content of which is incorporated herein by reference.

BACKGROUND

1. Field

The described technology relates generally to an organic light emitting diode display. More particularly, the described technology relates to an organic light emitting diode display that makes use of a refractive index.

2. Description of the Related Technology

Organic light emitting diode displays have self-emissive characteristics, and have a relatively small thickness and weight due to not requiring a separate light source. Organic light emitting diode displays generally exhibit high-quality characteristics such as low power consumption, high luminance, high response speed, etc.

Conventional organic light emitting diode displays generally include a first substrate having an organic light emitting diode and a second substrate facing the first substrate and protecting the organic light emitting diode of the first substrate. The organic light emitting diode includes an organic emission layer for emitting light, and a first electrode and a second electrode, which face each other, with the organic emission layer interposed therebetween.

Conventional organic light emitting diode displays are classified into (1) a top emission type, in which light emitted from the organic light emitting diode is irradiated in the direction of the second substrate, (2) a bottom emission type, in which light emitted from the organic light emitting diode is irradiated in the direction of the first substrate, and (3) a double-side emission type, in which light emitted from the organic light emitting diode is irradiated in the directions of both the first and second substrates.

In a top emission type of display, the organic light emitting diode generally has a structure in which the first electrode is light reflective and the second electrode is semi-transmissive. Such a top emission type organic light emitting diode display has a microcavity structure.

When an organic light emitting diode display becomes larger in size, it is generally difficult to realize a large-sized organic light emitting diode display of a top emission type. The difficulty is related to the fact that the second electrode is generally made of a thin film in order to make it semi-transmissive, and the it usually needs to be formed as one layer over the entire organic light emitting diode display. In large organic light emitting diodes, sheet resistance of the second electrode increases, making the flow of current through the second electrode less smooth.

Due to the difficulty above, larger size organic light emitting diode displays are generally of a bottom-emission type, which can make the thickness of the second electrode sufficiently large.

Bottom emission type organic light emitting diode displays generally have lower luminous efficiency and color reproduction when compared to top emission type organic light emitting diode displays.

In recent years, a bottom emission type organic light emitting diode display with different thicknesses for each organic emission layer, according to the wavelength of light (red, green, or blue light) emitted from each organic emission layer has been developed. In such displays, a deposition process using an additional mask is generally used in order to vary the thickness of each organic emission layer, thereby increasing the overall manufacturing time and complexity.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode display, including: a substrate, a first electrode positioned on the substrate, where the first electrode is configured to substantially transmit visible light therethrough, an organic emission layer positioned on the first electrode, a second electrode positioned on the organic emission layer, where the second electrode is configured to substantially reflect visible light, and a semi-transmissive layer positioned between the substrate and the first electrode, where the semi-transmissive layer includes a plurality of refractive sub-layers, which are configured not to carry an electrical signal or current, where two abutting ones of the plurality of sub-layers have different refractive indices.

Another aspect is an organic light emitting diode display, including: a first substrate, a first electrode positioned over the first substrate and configured to substantially transmit visible light therethrough, a semi-transmissive layer positioned between the first substrate and the first electrode, where the semi-transmissive layer includes a plurality of refractive sub-layers, where each refractive sub-layer has a refractive index different than the refractive index of abutting sub-layers, and where the refractive sub-layers are each configured to at least partially reflect and to at least partially transmit light incident to the each refractive sub-layer, an organic emission layer positioned over the first electrode, where the organic emission layer includes first, second and third emitting sub-layers, where the emitting sub-layers are laterally placed with one another, and at least one auxiliary layer positioned between the first electrode and at least one of the emitting sub-layers such that at least one of the emitting sub-layers is spaced further away from the first electrode than the other emitting sub-layers, and where the at least one auxiliary layer is formed of the same material as the first electrode, and a second electrode positioned over the organic emission layer, configured to substantially reflect visible light.

Another aspect is an organic light emitting diode device where the plurality of refractive sub-layers each include an insulating material containing at least one of silicon oxide (SiO2), silicon nitride (SiNx), niobium oxide (Nb2O5), and titanium oxide (TiO2).

Another aspect is an organic light emitting diode device where the plurality of refractive sub-layers includes: a first refractive sub-layer positioned between the substrate and the first electrode, and having a first refractive index, and a second refractive sub-layer positioned between the first refractive sub-layer and the substrate, having a second refractive index that is greater than the first refractive index.

Another aspect is an organic light emitting diode device where the thickness of the first refractive sub-layer and the thickness of the second refractive sub-layer are about the same.

Another aspect is an organic light emitting diode device where the plurality of refractive sub-layers further includes: a third refractive sub-layer positioned between the second refractive sub-layer and the substrate, having a third refractive index that is about the same as the first refractive index, and a fourth refractive sub-layer positioned between the third refractive sub-layer and the substrate, having a fourth refractive index that is about the same as the second refractive index.

Another aspect is an organic light emitting diode device where the thickness of the third refractive sub-layer is greater than the thickness of the first refractive sub-layer.

Another aspect is an organic light emitting diode device where the thickness of the fourth refractive sub-layer is greater than the thickness of the second refractive sub-layer.

Another aspect is an organic light emitting diode device where the first refractive index is about 1.5, and the second refractive index is about 1.9.

Another aspect is an organic light emitting diode device where the plurality of refractive sub-layers further includes: a fifth refractive sub-layer positioned between the fourth refractive sub-layer and the substrate, having a fifth refractive index that is about the same as the first refractive index, and a sixth refractive sub-layer positioned between the fifth refractive sub-layer and the substrate, having a sixth refractive index that is about the same as the second refractive index.

Another aspect is an organic light emitting diode device where the thickness of the fifth refractive sub-layer is about the same as the thickness of the third refractive sub-layer, and the thickness of the sixth refractive sub-layer is about the same as the thickness of the fourth refractive sub-layer.

Another aspect is an organic light emitting diode device where the organic emission layer includes a first main emitting layer for emitting red light, a second main emitting layer for emitting green light, a third main emitting layer for emitting blue light, and a first auxiliary layer positioned between the second main emitting layer and the substrate, where the second main emitting layer is spaced apart from the substrate further than the first and third main emitting layers.

Another aspect is an organic light emitting diode device where the first electrode is configured to be an anode, and the first auxiliary layer is positioned between the second main emitting layer and the first electrode, where the auxiliary layer is configured to permit holes injected from the first electrode to the second main emitting layer to pass.

Another aspect is an organic light emitting diode device where the first auxiliary layer is positioned between the organic emission layer and the first electrode, and is formed of substantially the same material as the first electrode.

Another aspect is an organic light emitting diode device where the first auxiliary layer is positioned between the first electrode and the first refractive sub-layer.

Another aspect is an organic light emitting diode device where the first auxiliary layer has a refractive index that is about the same as the second refractive index.

Another aspect is an organic light emitting diode device where the organic emission layer further includes a second auxiliary layer positioned between the first electrode and the first refractive sub-layer, such that the first main emitting layer is spaced apart from the substrate further than the second and third main emitting layers.

Another aspect is an organic light emitting diode device where the first auxiliary layer and the second auxiliary layer have refractive indices which are about the same as the second refractive index.

Another aspect is an organic light emitting diode device where the display is configured to permit light beams emitted from the organic emission layer to be refracted at different angles by the plurality of refractive sub-layers, thereby mutually reinforcing the light beams.

Another aspect is an organic light emitting diode device where at least two consecutive ones of the plurality of refractive sub-layers are repeated at least once within the refractive layer Another aspect is an organic light emitting diode device where the refractive index of a refractive sub-layer is greater than the refractive index of an abutting refractive sub-layer, and is about the same as the refractive index of a non-abutting refractive sub-layer.

Another aspect is an organic light emitting diode device where the plurality of refractive sub-layers includes at least one layer of a first thickness, and at least one layer of a second thickness.

Another aspect is an organic light emitting diode device where the plurality of refractive sub-layers each include a light semi-transmissive insulating material containing at least one of silicon oxide ($SiO_2$), silicon nitride ($SiN_x$), niobium oxide ($Nb_2O_5$), and titanium oxide ($TiO_2$).

Another aspect is an organic light emitting diode device where the at least one auxiliary layer is integrated in the first electrode.

BRIEF DESCRIPTION OF THE DRAWINGS

FIG. 6 is a table showing color characteristics of light measured for each of the organic light emitting diode displays according to an exemplary embodiment and the comparative example.

FIG. 9 is a table showing the color characteristics of light measured for each of the organic light emitting diode displays according to an exemplary embodiment and the comparative example.

FIG. 12 is a table showing the color characteristics of light measured for each of the organic light emitting diode displays according to an exemplary embodiment and the comparative example.

FIG. 15 is a table showing the color characteristics of light measured for each of the organic light emitting diode displays according to an exemplary embodiment and the comparative example.

FIG. 18 is a table showing the color characteristics of light measured for each of the organic light emitting diode displays according to an exemplary embodiment and the comparative example.

FIG. 21 is a table showing the color characteristics of light measured for each of the organic light emitting diode displays according to an exemplary embodiment and the comparative example.

DETAILED DESCRIPTION OF CERTAIN INVENTIVE EMBODIMENTS

Figure 1:
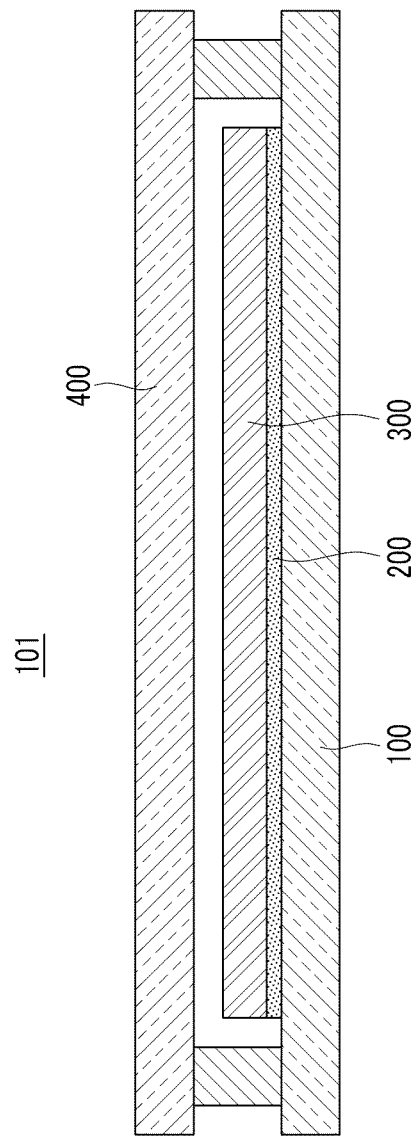
FIG. 1 is a cross-sectional view of an organic light emitting diode display according to an exemplary embodiment.

Hereinafter, various exemplary embodiments will be described in detail with reference to the attached drawings. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification.

In the drawings, the sizes and thicknesses of the components are merely shown for convenience of explanation, and the embodiments are not necessarily limited to the illustrations described and shown herein.

When an element such as a layer, a film, an area, a plate, etc. is referred to as being formed on another element, the element may be formed right on another element or the element may be formed on another element with a further element therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

An organic light emitting diode display 101 according to an exemplary embodiment will be described with reference to FIGS. 1 thru 5.

FIG. 1 is a cross-sectional view showing an organic light emitting diode display according to an exemplary embodiment.

As shown in FIG. 1, the organic light emitting diode 101 according to an exemplary embodiment includes a first substrate 100, driving circuitry 200, an organic light emitting diode 300, and a second substrate 400.

The first substrate 100 and the second substrate 400 are light transmissive and are each formed of an electrically insulating material such as glass, polymer, or the like. The first substrate 100 and the second substrate 400 face each other, and are bonded together by a sealant. Driving circuitry 200 and the organic light emitting diode 300 are positioned between the first substrate 100 and the second substrate 400, and the first substrate 100 and the second substrate 400 protect the driving circuitry 200 and the organic light emitting diode 300 from external interference.

Driving circuitry 200 includes switching and driving thin film transistors 10 and 20 (shown in FIG. 2), and transmits a driving signal to the organic light emitting diode 300. The organic light emitting diode 300 emits light according to a signal received from driving circuitry 200.

The organic light emitting diode 300 is positioned on driving circuitry 200.

The organic light emitting diode 300 is positioned in a display area on the first substrate 100, and is formed using microelectromechanical systems (MEMS) technology, such as photolithography. The organic light emitting diode 300 receives signals from driving circuitry 200, and displays an image by the received signals.

The internal structure of the organic light emitting diode display 101 according to an exemplary embodiment will be described in detail with reference to FIGS. 2 thru 5.

Figure 2:
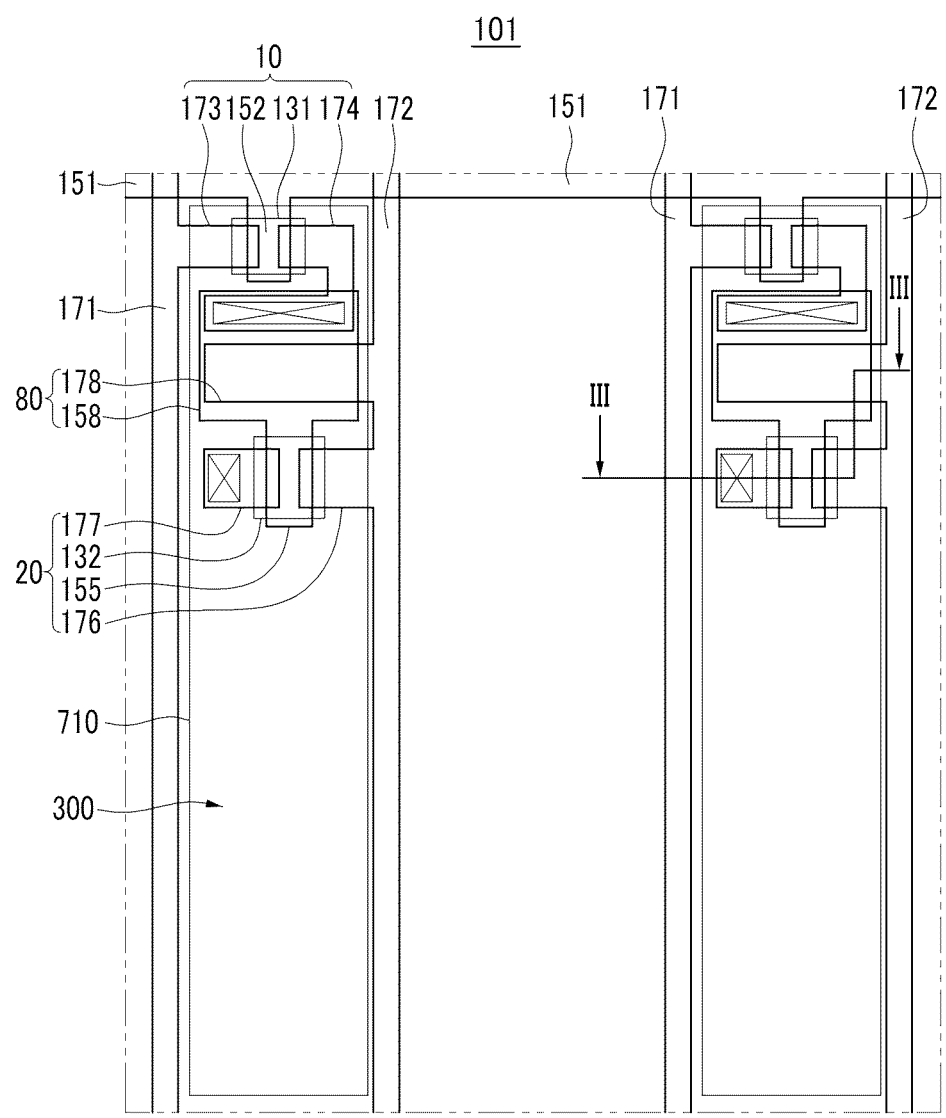
FIG. 2 is a layout view of a pixel structure of a display device according to an exemplary embodiment.
Figure 3:
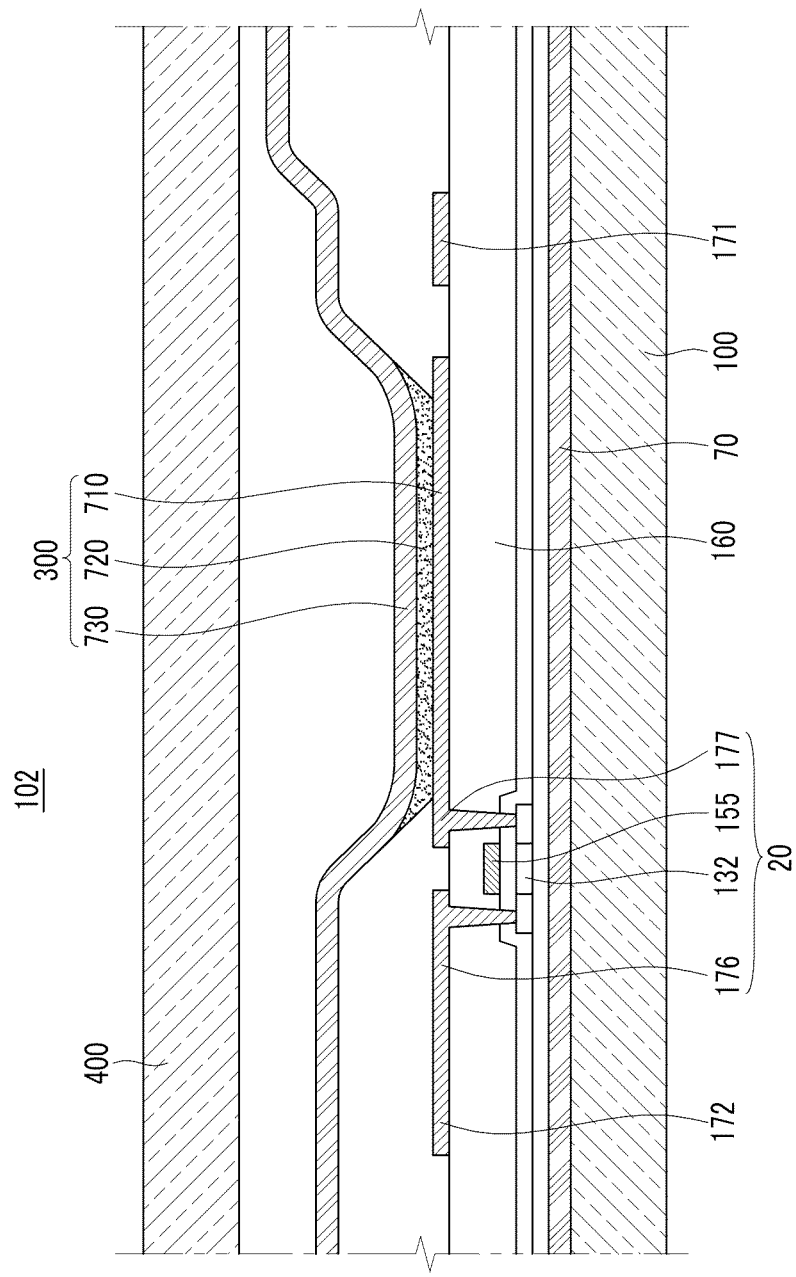
FIG. 3 is a cross-sectional view taken along line of FIG. 2.

FIG. 2 is a layout view of a pixel structure of a display device according to an exemplary embodiment. FIG. 3 is a cross-sectional view taken along line III-III of FIG. 2.

One embodiment of the structures of the driving circuitry 200 and the organic light emitting diode 300 are shown in FIGS. 2 and 3. Other structures of driving circuitry 200 and the organic light emitting diode 300 are also possible in other embodiments. For example, although the accompanied drawings illustrate an active matrix (AM) type of organic light emitting diode display having a 2Tr-1Cap structure as a display device, in which one pixel includes two thin film transistors (TFTs) and one capacitor, other embodiments are also possible. The number of thin film transistors, the number of capacitors, and the number of lines of the display device are not limited to the embodiment shown in FIGS. 2 and 3. A pixel refers to the smallest unit displaying an image, and the display device displays an image through a plurality of pixels.

As shown in FIG. 2 and FIG. 3, each pixel of an embodiment of the organic light emitting diode display 101 includes a switching thin film transistor 10, a driving thin film transistor 20, a capacitor 80, an organic light emitting diode 300, and a semi-transmissive layer 70. A component including the switching thin film transistor 10, the driving thin film transistor 20, and the capacitor 80 is referred to as driving circuitry 200. The driving circuitry 200 further includes a gate line 151 arranged along one direction of the first substrate 100, a data line 171 insulated from and crossing the gate line 151, and a common power line 172. In one embodiment, one pixel may be defined by the gate line 151, the data line 171, and the common line 172. Other embodiments are also possible.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 may be used as a switching element to select a pixel to emit light. The switching gate electrode 152 is connected to the gate line 151. The switching source electrode 173 is connected to the data line 171. The switching drain electrode 174 is spaced apart from the switching source electrode 173 by a distance, and is connected to a capacitor plate (158 in one embodiment).

The driving thin film transistor 20 applies a driving power to the first electrode 710 to emit light from the organic emission layer 720 of the organic light emitting diode 300 in the selected pixel. The driving gate electrode 155 is connected to the capacitor plate 158, which is in turn connected to the switching drain electrode 174. The driving source electrode 176 and another capacitor plate (178 in one embodiment) are connected to the common power line 172. The first electrode 710 of the organic light emitting diode 300 extends from the driving drain electrode 177, and the driving drain electrode 177 and the first electrode 710 are connected to each other.

The capacitor 80 includes a pair of the capacitor plates 158 and 178, disposed with an interlayer insulating layer 160 interposed therebetween. The interlayer insulating layer 160 may be a dielectric material, and the storage capacity of the capacitor 80 is determined by the electric charges stored in the capacitor 80 and the voltage between the capacitor plates 158 and 178.

The switching thin film transistor 10 is driven by a gate voltage applied to the gate line 151, and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 300 through the driving thin film transistor 20 to cause the organic light emitting diode 300 emit light.

The organic light emitting diode 300 includes a first electrode 710, an organic emission layer 720 positioned on the first electrode 710, and a second electrode 730 positioned on the organic emission layer 720.

Figure 4:
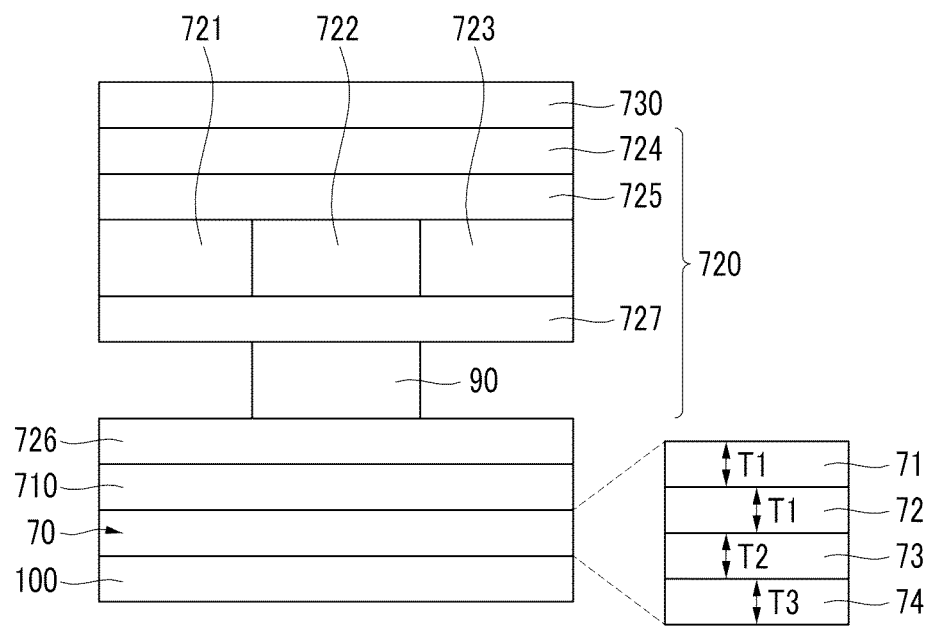
FIG. 4 is a cross-sectional view showing the main components of the organic light emitting diode display according to an exemplary embodiment.

FIG. 4 is a cross-sectional view showing the main components of the organic light emitting diode display according to an exemplary embodiment.

In the embodiment of FIG. 4, the first electrode 710 is an anode functioning as a hole injection electrode, and the second electrode 730 is a cathode functioning as an electron injection electrode. In other embodiments, the first electrode 710 may be a cathode and the second electrode 730 may be an anode according to a driving method of the organic light emitting diode display 101. Holes and electrons may be injected into the organic emission layer 720 from the first electrode 710 and the second electrode 730, and when excitons formed by recombinations of the injected holes and electrons drop from an excited state to a ground state, the organic emission layer 720 emits light. The first electrode 710 may include a single layer or multiple layers of a light transmissive conductive material containing at least one of indium tin oxide (ITO), indium zinc oxide (IZO), and silver (Ag), and the second electrode 730 may include a single layer or multiple layers of a light reflective conductive material containing at least one of aluminum (Al) and silver (Ag).

The organic emission layer 720 includes a first main emitting layer 721 for emitting red light, a second main emitting layer 722 for emitting green light, and a third main emitting layer 723 for emitting blue light. The first main emitting layer 721, the second main emitting layer 722, and the third main emitting layer 723 are layers where the holes and the electrons that are injected from the first electrode 710 and the second electrode 730 are combined, and emit the respective lights.

The organic emission layer 720 further includes an electron injection layer 724, an electron transport layer 725, a hole injection layer 726, a first auxiliary layer 90, and a hole transport layer 727.

The electron injection layer 724 and the electron transport layer 725 are positioned between the second electrode 730 and the first, second, and third main emitting layers 721, 722, and 723, and function to inject electrons from the second electrode 730 to the first, second, and third main emitting layers 721, 722, and 723. The hole injection layer 726, and the hole transport layer 727 are positioned between the first electrode 710 and the first, second, and third main emitting layers 721, 722, and 723, and function to inject holes from the first electrode 710 to the first, second, and third main emitting layers 721, 722, and 723. The first auxiliary layer 90 is positioned between the hole injection layer 726 and the hole transport layer 726 and separates the second main emitting layer 722 from the first electrode 710. The holes injected from the first electrode 710 to the second main emitting layer 722 pass through the first auxiliary layer 90. The second main emitting layer 722 is thus spaced further from the first substrate 100 than the first main emitting layer 721 and the third main emitting layer 723.

The first auxiliary layer 90 is formed of the same material as the hole injection layer 726 and the hole transport layer 727, and hence performs the same function as the hole injection layer 726 and/or the hole transport layer 727. In some embodiments, the auxiliary layer is integrated in the first electrode.

In a bottom emission type organic light emitting diode display 101 according to an exemplary embodiment, the organic light emitting diode 300 emits light in the direction of the first substrate 100. The semi-transmissive layer 70 is positioned between the first substrate 100 and the first electrode 710 on a path through which light is emitted from the organic emission layer 720 to the first substrate 100.

The semi-transmissive layer 70 irradiates a portion of the light emitted from the organic emission layer 720 and directed to the semi-transmissive layer 70, and transmits the other portion. The semi-transmissive layer 70 includes a plurality of refractive layers having different refractive indexes. The semi-transmissive layer 70 includes a first refractive layer 71, a second refractive layer 72, a third refractive layer 73, and a fourth refractive layer 74. The first refractive layer 71, the second refractive layer 72, the third refractive layer 73, and the fourth refractive layer 74 each include a light semi-transmissive insulating material containing at least one of silicon oxide ($SiO_2$), silicon nitride ($SiN_x$), niobium oxide ($Nb_2O_5$), and titanium oxide ($TiO_2$).

The first refractive layer 71 is positioned between the first substrate 100 and the first electrode 710, and has a first refractive index of about 1.3 to about 1.7. In one embodiment, the first refractive index is about 1.5. The first refractive layer 71 has a first thickness T1. The first refractive layer 71 serves to refract the lights emitted from the organic emission layer 720 and transmitted to the first refractive layer 71, and/or to refract the light reflected by the second refractive layer 72 and transmitted to the first refractive layer 71, based on the first refractive index and the first thickness T1.

The second refractive layer 72 is positioned between the first refractive layer 71 and the first substrate 100, and has a second refractive index, greater than the first, of about 1.7 to about 2.1. In one embodiment, the second refractive index is about 1.9. The second refractive layer 72 has the same first thickness T1. Although the second refractive layer 72 has the first thickness T1, since the second refractive index is greater than the first refractive index, the lights transmitted to the second refractive layer 72 are more refracted than the lights transmitted to the first refractive layer 71.

The second refractive layer 72 serves to refract the lights emitted from the organic emission layer 720 and transmitted to the second refractive layer 72 through the first refractive layer 71, and/or to refract the lights reflected by the third refractive layer 73 and transmitted to the second refractive layer 72, based on the second refractive index and the first thickness T1.

The third refractive layer 73 is positioned between the first substrate 100 and the second refractive layer 72, and has a refractive index which is the same as the first refractive index. The third refractive layer 73 has a second thickness T2, which is greater than the first thickness T1. Although the third refractive layer 73 has the same refractive index as the first refractive layer 71, since the second thickness T2 is greater than the first thickness T1 the lights transmitted to the third refractive layer 73 are more refracted than the lights transmitted to the first refractive layer 71. The third refractive layer 73 serves to refract the lights emitted from the organic emission layer 720 and transmitted to the third refractive layer 73 through the first refractive layer 71 and the second refractive layer 72, and/or to refract the lights reflected by the fourth refractive layer 74 and transmitted to the third refractive layer 73, based on the first refractive index and the second thickness T2.

The fourth refractive layer 74 is positioned between the first substrate 100 and the third refractive layer 73, and has a refractive index which is the same as the second refractive index. The fourth refractive layer 74 has a third thickness T3, which is greater than the first thickness T1. Although the fourth refractive layer 74 has the same refractive index as the second refractive layer 72, since the third thickness T3 is greater than the first thickness T1, the lights transmitted to the fourth refractive layer 74 are more refracted than the lights transmitted to the second refractive layer 72. The fourth refractive layer 74 serves to refract the lights emitted from the organic emission layer 720 and transmitted to the fourth refractive layer 73 through the first refractive layer 71, the second refractive layer 72, and the third refractive layer 73, based on the second refractive index and the third thickness T3.

The lights emitted from the organic emission layer 720 are refracted at different angles by the first refractive layer 71, the second refractive layer 72, the third refractive layer 73, and the fourth refractive layer 74, respectively. That is, the semi-transmissive layer 70 gradually refracts the lights emitted from the organic emission layer 720 and passing through the semi-transmissive layer 70 at different angles using the first refractive layer 71, the second refractive layer 72, the third refractive layer 73, and the fourth refractive layer 74, thereby strengthening the lights emitted from the organic emission layer 720 and repeatedly reflected between the second electrode 730 and the first electrode 710.

By gradually refracting the lights repeatedly reflected or transmitted between the second electrode 730 and the semi-transmissive layer 70 at different angles, the organic light emitting diode display 101 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 101.

In some embodiments, the first electrode 710 is light transmissive and the second electrode 730 is light reflective. In other embodiments, the first electrode 710 may be light reflective and the second electrode 730 may be light transmissive. In such embodiments, the semi-transmissive layer may be positioned between the second electrode and the second substrate.

According to some embodiments, the semi-transmissive layer 70 is positioned spaced apart from the first electrode 710. In other embodiments, the semi-transmissive layer may be positioned in contact with the first electrode. In such embodiments, the semi-transmissive layer may be made of a conductive material or an insulating material.

An exemplary embodiment demonstrating improvement of luminous efficiency and color reproduction of an organic light emitting diode display will be described with reference to FIGS. 5 and 6. The thicknesses of the components to be described below are represented by the numbers in parentheses, and the unit of thickness is Å.

Figure 5:
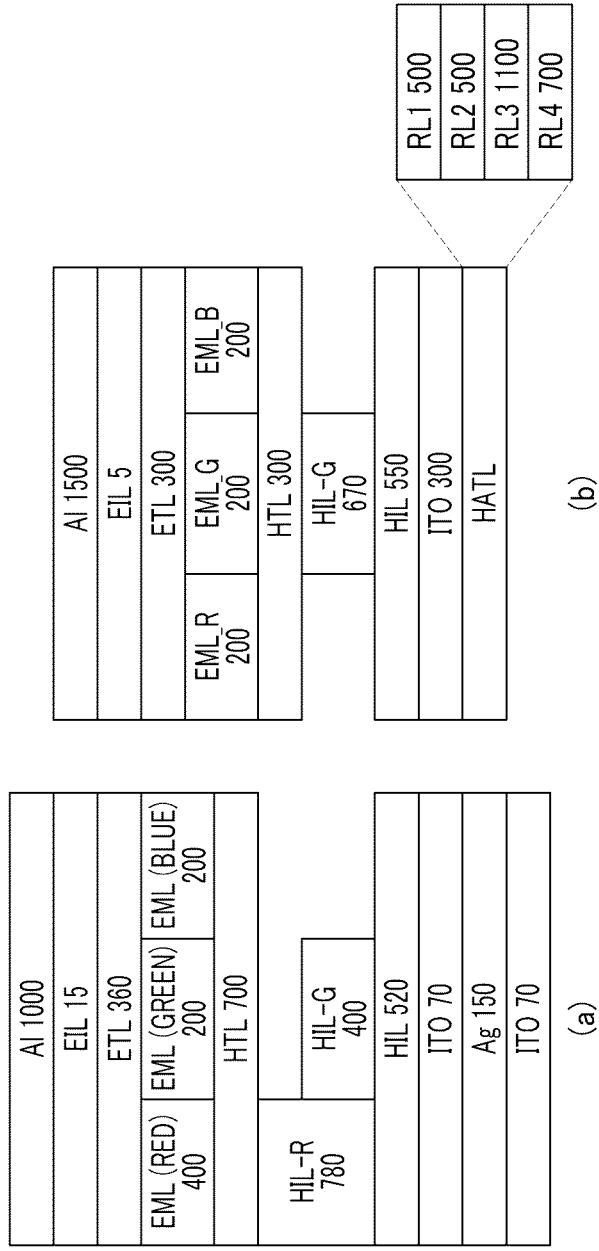
FIG. 5 shows cross-sectional views of the main components of each of organic light emitting diode displays according to an exemplary embodiment and a comparative example.

FIG. 5 shows cross-sectional views of the main components of each of organic light emitting diode displays according to an exemplary embodiment and a comparative example. FIG. 6 is a table showing color characteristics of light measured for each of the organic light emitting diode displays according to an exemplary embodiment and the comparative example.

FIG. 5(a) shows a cross-sectional view of an organic light emitting diode display according to a comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a second transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 6. The efficiency of red light, green light, and blue light measured for the organic light emitting diode display according to the comparative example is 100%.

FIG. 5(b) shows a cross-sectional view of an organic light emitting diode display according to an exemplary embodiment. An organic light emitting diode display according to an exemplary embodiment includes a semi-transmissive layer, a first electrode, an organic emission layer, and a second electrode. The semi-transmissive layer HATL includes a first refractive layer RL1 (500), a second refractive layer RL2 (500), a third refractive layer RL3 (1100), and a fourth refractive layer RL4 (700), the first electrode includes a light transmissive layer ITO (300) made of ITO, the organic emission layer includes a hole injection layer HIL (550), a first auxiliary layer HTL-G (670) formed of the same material as the hole transport layer, a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 6.

A comparison of the efficiencies of red, green, and blue lights measured for the organic light emitting diode display according to the comparative example and those according to an exemplary embodiment demonstrates that an organic light emitting diode display according to an exemplary embodiment has lower efficiency of blue light and a higher efficiency of red and green lights. There is an improvement of about 21.6% in terms of color reproduction between the comparative example and the exemplary embodiment of FIG. 5(b).

The exemplary embodiment of FIG. 5(b), which includes the semi-transmissive layer 70, demonstrates improved luminous efficiency and color reproduction. Additionally, the organic light emitting diode display 101 according to the exemplary embodiment of FIG. 5(b) is a bottom emission type, and can thus be used in a large-sized display device for improving luminous efficiency and color reproduction in such a device.

Since the organic light emitting diode display 101 according to the exemplary embodiment of FIG. 5(b) includes the semi-transmissive layer 70, the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 101.

An organic light emitting diode display 102 according to an exemplary embodiment will be described with reference to FIG. 7.

Figure 7:
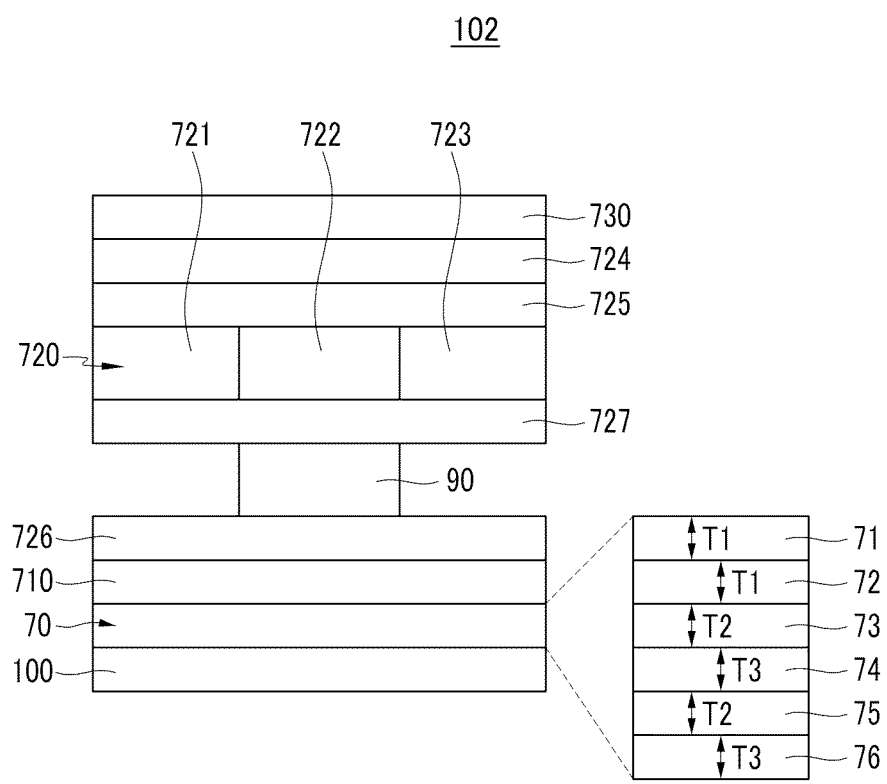
FIG. 7 is a cross-sectional view showing main components of an organic light emitting diode display according to an exemplary embodiment.

FIG. 7 is a cross-sectional view showing the main components of an organic light emitting diode display according to an exemplary embodiment.

In the embodiment of FIG. 7, a semi-transmissive layer 70 includes a first refractive layer 71, a second refractive layer 72, a third refractive layer 73, a fourth refractive layer 74, a fifth refractive layer 75, and a sixth refractive layer 76 that are sequentially stacked starting from the first refractive layer 71.

The fifth refractive layer 75 is positioned between a first substrate 100 and the fourth refractive layer 74, and has a first refractive index, which is substantially the same as the refractive index of the first refractive layer 71. The fifth refractive layer 75 has a second thickness T2, which is substantially the same as the thickness of the third refractive layer 73. The fifth refractive layer 75 serves to refract the lights emitted from an organic emission layer 720 and transmitted to the fifth refractive layer 75 through the first refractive layer 71, the second refractive layer 72, the third refractive layer 73, and the fourth refractive layer 74, and/or the lights reflected by the sixth refractive layer 76 and transmitted to the fifth refractive layer 75, based on the first refractive index and the second thickness T2.

The sixth refractive layer 76 is positioned between the first substrate 100 and the fifth refractive layer 75, and has a second refractive index, which is substantially the same as the refractive index of the second refractive layer 72. The sixth refractive layer 76 has a third thickness T3, which is substantially the same as the thickness of the fourth refractive layer 74. The sixth refractive layer 76 serves to refract the lights emitted from the organic emission layer 720 and transmitted to the sixth refractive layer 76 through the first refractive layer 71, the second refractive layer 72, the third refractive layer 73, the fourth refractive layer 74, and the fifth refractive layer 75, based on the second refractive index and the third thickness T3.

The lights emitted from the organic emission layer 720 are refracted at different angles by the first refractive layer 71, the second refractive layer 72, the third refractive layer 73, the fourth refractive layer 74, the fifth refractive layer 75, and the sixth refractive layer 76. That is, the semi-transmissive layer 70 gradually refracts the lights emitted from the organic emission layer 720 and passing through the semi-transmissive layer 70 at different angles using the first refractive layer 71, the second refractive layer 72, the third refractive layer 73, the fourth refractive layer 74, the fifth refractive layer 75, and the sixth refractive layer 76, thereby strengthening the lights emitted from the organic emission layer 720 and repeatedly reflected between a second electrode 730 and a first electrode 710.

By gradually refracting the lights repeatedly reflected or transmitted between the second electrode 730 and the semi-transmissive layer 70 at different angles, the organic light emitting diode display 102 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 102.

An exemplary embodiment demonstrating improvement of luminous efficiency and color reproduction of an organic light emitting diode display will be described with reference to FIGS. 8 and 9. The thicknesses of the components to be described below are represented by the numbers in parentheses, and the unit of thickness is Å.

Figure 8:
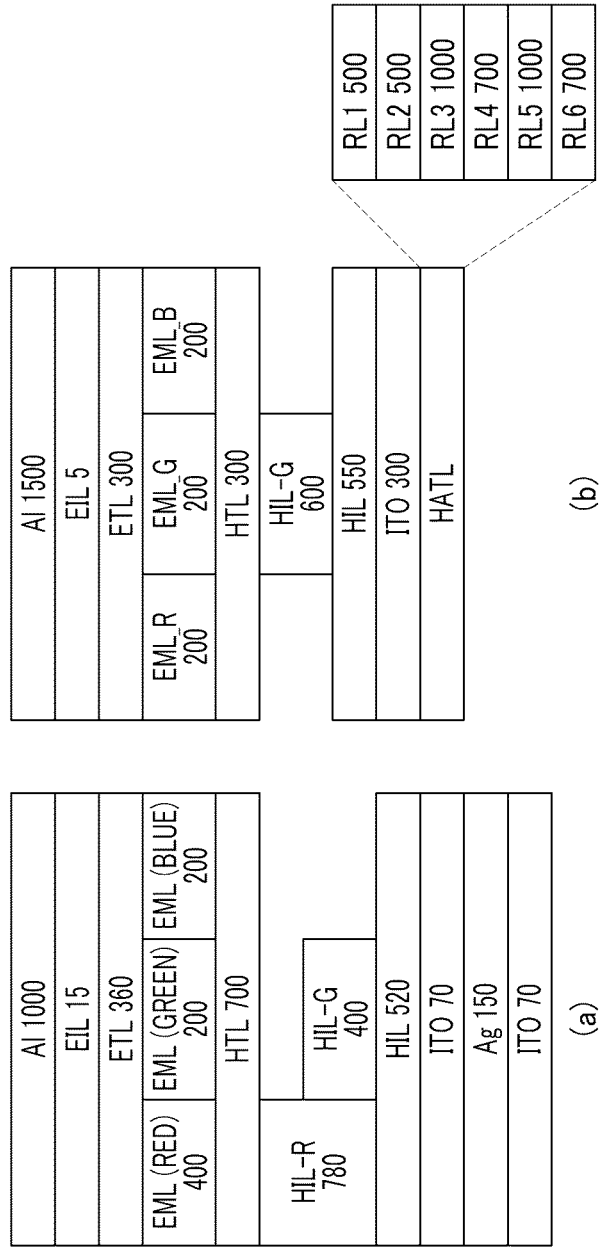
FIG. 8 shows cross-sectional views of the main components of each of organic light emitting diode displays according to an exemplary embodiment and the comparative example.

FIG. 8 shows cross-sectional views of the main components of each of organic light emitting diode displays according to an exemplary embodiment and the comparative example. FIG. 9 is a table showing the color characteristics of light measured for each of the organic light emitting diode displays according to an exemplary embodiment and the comparative example.

FIG. 8(a) shows a cross-sectional view of an organic light emitting diode display according to the comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a second transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 9. The efficiency of red light, green light, and blue light measured for the organic light emitting diode display according to the comparative example is 100%.

FIG. 8(b) shows a cross-sectional view of an organic light emitting diode display according to an exemplary embodiment. An organic light emitting diode display according to an exemplary embodiment includes a semi-transmissive layer, a first electrode, an organic emission layer, and a second electrode. The semi-transmissive layer HATL includes a first refractive layer RL1 (500), a second refractive layer RL2 (500), a third refractive layer RL3 (1100), a fourth refractive layer RL4 (700), a fifth refractive layer RL5 (1000), and a sixth refractive layer RL6 (700), the first electrode includes a light transmissive layer ITO (300) made of ITO, the organic emission layer includes a hole injection layer HIL (550), a first auxiliary layer HTL-G (600) formed of the same material as the hole transport layer, a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 9.

A comparison of the efficiencies of red, green, and blue lights measured for the organic light emitting diode display according to the comparative example and those according to an exemplary embodiment demonstrates that an organic light emitting diode display according to an exemplary embodiment has a lower efficiency of blue light and a higher efficiency of red and green lights. There is an improvement of about 28% as in terms of color reproduction between the comparative example and the exemplary embodiment of FIG. 8(*b*).

The exemplary embodiment of FIG. 8(*b*), which includes the semi-transmissive layer 70, demonstrates improved luminous efficiency and color reproduction. Additionally, the organic light emitting diode display 102 according to the exemplary embodiment is a bottom emission type, and can thus be used in a large-sized display device for improving luminous efficiency and color reproduction in such a device.

Since the organic light emitting diode display 102 according to the exemplary embodiment of FIG. 8(*b*) includes the semi-transmissive layer 70, so the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 102.

An organic light emitting diode display 103 according to an exemplary embodiment will be described with reference to FIG. 10.

Figure 10:
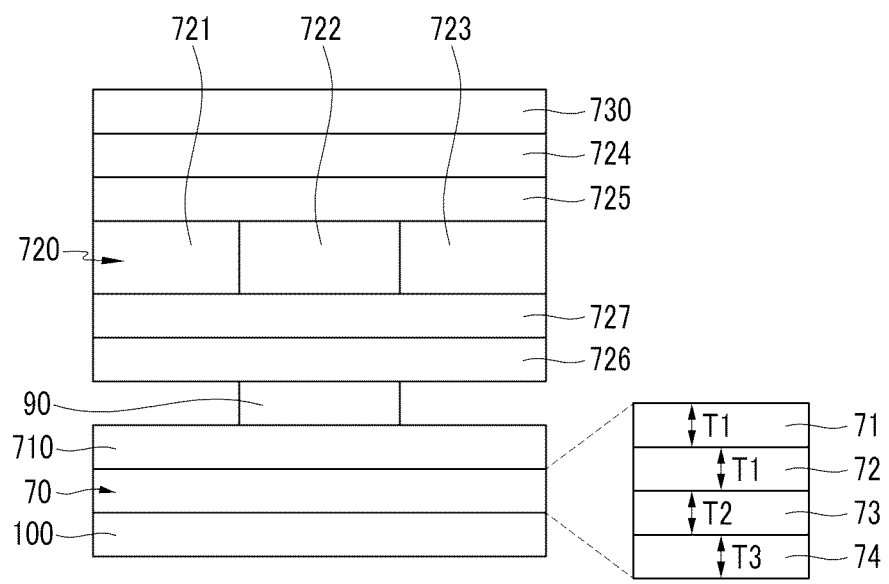
FIG. 10 is a cross-sectional view showing the main components of an organic light emitting diode display according to an exemplary embodiment.

FIG. 10 is a cross-sectional view showing the main parts of an organic light emitting diode display according to an exemplary embodiment.

In the embodiment of FIG. 10, an organic emission layer 720 includes an electron injection layer 724, an electron transport layer 725, a hole injection layer 726, and a hole transport layer 727.

A first auxiliary layer 90 is positioned between the organic emission layer 720 and a first electrode 710. The first auxiliary layer 90 is formed of the same material as the first electrode 710, and hence performs the same function as the first electrode 710. The first auxiliary layer 90 is positioned between a second main emitting layer 722 and the first electrode 710, corresponding to the second main emitting layer 722 so that the second main emitting layer 722 is spaced apart from a first substrate 100 further than a first main emitting layer 721 and a third main emitting layer 723. In some embodiments, the auxiliary layer is integrated in the first electrode.

A semi-transmissive layer 70 includes a first refractive layer 71, a second refractive layer 72, a third refractive layer 73, and a fourth refractive layer 74.

By gradually refracting the lights repeatedly reflected or transmitted between a second electrode 730 and the semi-transmissive layer 70 at different angles, the organic light emitting diode display 103 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 103.

An exemplary embodiment demonstrating improvement of luminous efficiency and color reproduction of an organic light emitting diode display will be described with reference to FIGS. 11 and 12. The thicknesses of the components to be described below are represented by the numbers in parentheses, and the unit of thickness is Å.

Figure 11:
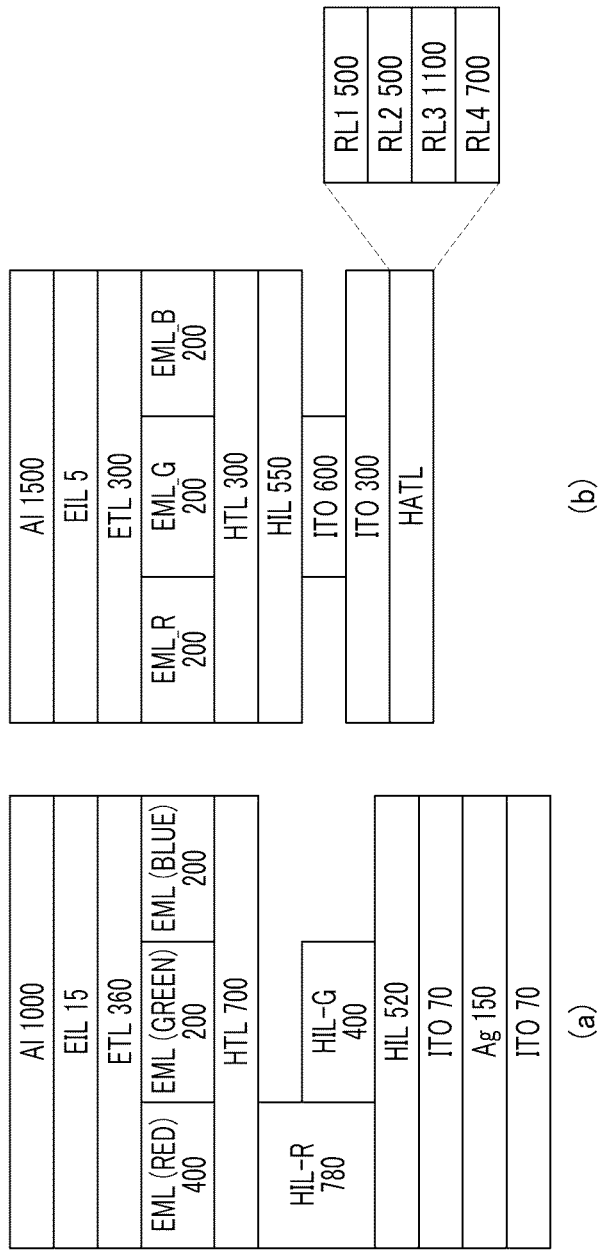
FIG. 11 shows cross-sectional views of the main components of each of organic light emitting diode displays according to an exemplary embodiment and the comparative example.

FIG. 11 shows cross-sectional views of the main components of each of organic light emitting diode displays according to an exemplary embodiment and the comparative example. FIG. 12 is a table showing the color characteristics of light measured for each of the organic light emitting diode displays according to an exemplary embodiment and the comparative example.

FIG. 11(*a*) shows a cross-sectional view of an organic light emitting diode display according to the comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a third transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 12. The efficiency of red light, green light, and blue light measured for the organic light emitting diode display according to the comparative example is 100%.

FIG. 11(*b*) shows a cross-sectional view of an organic light emitting diode display according to an exemplary embodiment. An organic light emitting diode display according to an exemplary embodiment includes a semi-transmissive layer, a first electrode, a first auxiliary layer, an organic emission layer, and a second electrode. The semi-transmissive layer HATL includes a first refractive layer RL1 (500), a second refractive layer RL2 (500), a third refractive layer RL3 (1100), and a fourth refractive layer RL4 (700), the first electrode includes a first light transmissive layer ITO (300) made of ITO, the first auxiliary layer includes a second light transmissive layer ITO (600) made of ITO, the organic emission layer includes a hole injection layer HIL (550), a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 12.

A comparison of the efficiencies of red, green, and blue lights measured for the organic light emitting diode display according to the comparative example and those according to the an exemplary embodiment demonstrates that an organic light emitting diode display according to an exemplary embodiment has a lower efficiency of blue light and a higher efficiency of red and green lights. There is an improvement of about 20.1% in terms of color reproduction between the comparative example and the exemplary embodiment of FIG. 11(b).

The exemplary embodiment of FIG. 11(b), which includes the semi-transmissive layer 70, demonstrates improved luminous efficiency and color reproduction. Additionally, the organic light emitting diode display 103 according to the exemplary embodiment of FIG. 11(b) is a bottom emission type, and can thus be used in a large-sized display device for improving luminous efficiency and color reproduction in such a device.

Since the organic light emitting diode display 103 according to the exemplary embodiment of FIG. 11(b) includes the semi-transmissive layer 70, the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 103.

An organic light emitting diode display 104 according to an exemplary embodiment will be described with reference to FIG. 13.

Figure 13:
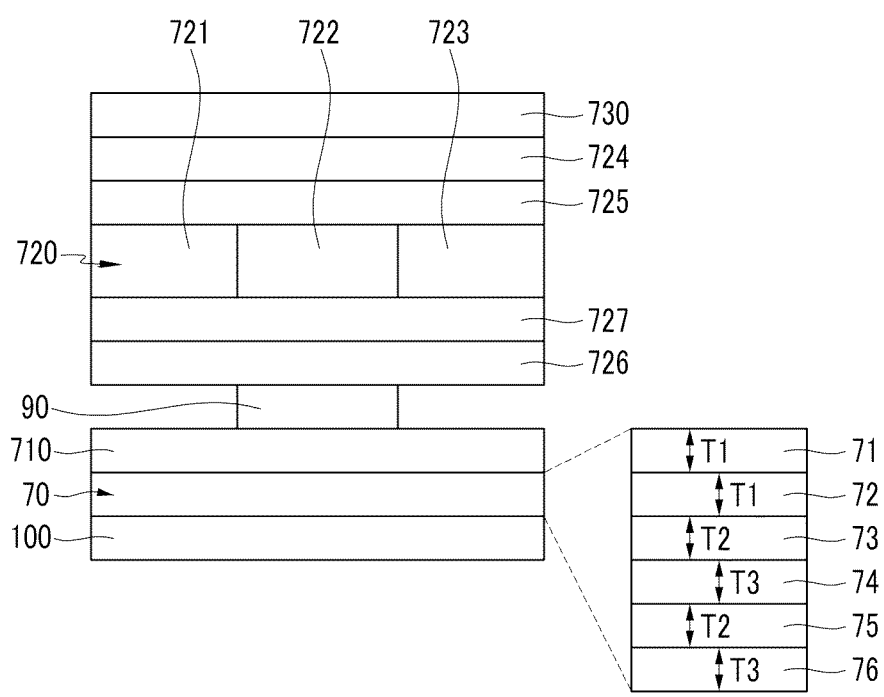
FIG. 13 is a cross-sectional view showing the main components of an organic light emitting diode display according to an exemplary embodiment.

FIG. 13 is a cross-sectional view showing the main components of an organic light emitting diode display according to an exemplary embodiment.

In the embodiment of FIG. 13, an organic emission layer 720 includes an electron injection layer 724, an electron transport layer 725, a hole injection layer 726, and a hole transport layer 727.

A first auxiliary layer 90 is positioned between the organic emission layer 720 and a first electrode 710. The first auxiliary layer 90 is formed of the same material as the first electrode 710, and hence performs the same function as the first electrode 710. The first auxiliary layer 90 is positioned between a second main emitting layer 722 and the first electrode 710, corresponding to the second main emitting layer 722 so that the second main emitting layer 722 is spaced apart from a first substrate 100 further than a first main emitting layer 721 and a third main emitting layer 723. In some embodiments, the auxiliary layer is integrated in the first electrode.

A semi-transmissive layer 70 includes a first refractive layer 71, a second refractive layer 72, a third refractive layer 73, a fourth refractive layer 74, a fifth refractive layer 75, and a sixth refractive layer 76 that are sequentially stacked starting from the first refractive layer 71.

The fifth refractive layer 75 is positioned between the first substrate 100 and the fourth refractive layer 74, and has a first refractive index, which is substantially the same as the refractive index of the first refractive layer 71. The fifth refractive layer 75 has a second thickness T2, which is substantially the same as the thickness of the third refractive layer 73. The fifth refractive layer 75 serves to refract the lights emitted from the organic emission layer 720 and transmitted to the fifth refractive layer 75 through the first refractive layer 71, the second refractive layer 72, the third refractive layer 73, and the fourth refractive layer 74, and/or the lights reflected by the sixth refractive layer 76 and transmitted to the fifth refractive layer 75, based on the first refractive index and the second thickness T2.

The sixth refractive layer 76 is positioned between the first substrate 100 and the fifth refractive layer 75, and has a second refractive index, which is substantially the same as the refractive index of the second refractive layer 72. The sixth refractive layer 76 has a third thickness T3, which is substantially the same as the thickness of the fourth refractive layer 74. The sixth refractive layer 76 serves to refract the lights emitted from the organic emission layer 720 and transmitted to the sixth refractive layer 76 through the first refractive layer 71, the second refractive layer 72, the third refractive layer 73, the fourth refractive layer 74, and the fifth refractive layer 75, based on the second refractive index and the third thickness T3.

The lights emitted from the organic emission layer 720 are refracted at different angles by the first refractive layer 71, the second refractive layer 72, the third refractive layer 73, the fourth refractive layer 74, the fifth refractive layer 75, and the sixth refractive layer 76. That is, the semi-transmissive layer 70 gradually refracts the lights emitted from the organic emission layer 720 and passing through the semi-transmissive layer 70 at different angles using the first refractive layer 71, the second refractive layer 72, the third refractive layer 73, the fourth refractive layer 74, the fifth refractive layer 75, and the sixth refractive layer 76, thereby strengthening the lights emitted from the organic emission layer 720 and repeatedly reflected between a second electrode 730 and the first electrode 710.

By gradually refracting the lights repeatedly reflected or transmitted between the second electrode 730 and the semi-transmissive layer 70 at different angles, the organic light emitting diode display 104 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 104.

An exemplary embodiment demonstrating improvement of luminous efficiency and color reproduction of an organic light emitting diode display will be described with reference to FIGS. 14 and 15. The thicknesses of the components to be described below are represented by the numbers in parentheses, and the unit of thickness is Å.

Figure 14:
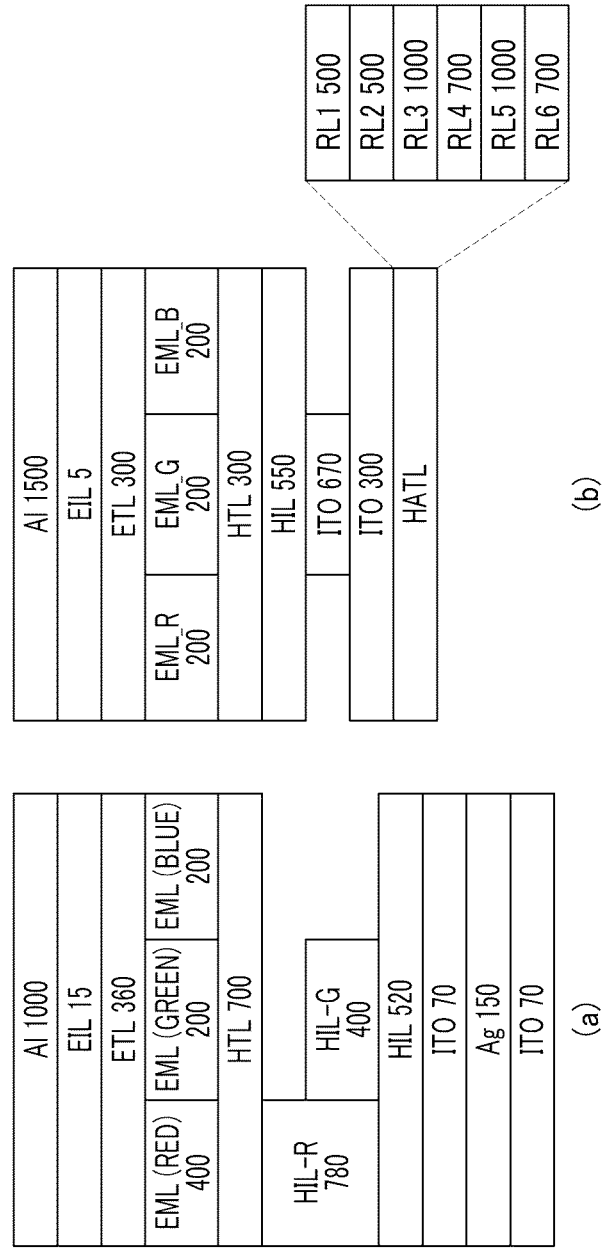
FIG. 14 shows cross-sectional views of the main components of each of organic light emitting diode displays according to an exemplary embodiment and the comparative example.

FIG. 14 shows cross-sectional views of the main components of each of organic light emitting diode displays according to an exemplary embodiment and the comparative example. FIG. 15 is a table showing the color characteristics of light measured for each of the organic light emitting diode displays according to an exemplary embodiment and the comparative example.

FIG. 14(a) shows a cross-sectional view of an organic light emitting diode display according to the comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a second transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 15. The efficiency of red light, green light, and blue light measured for the organic light emitting diode display according to the comparative example is 100%.

FIG. 14(b) shows a cross-sectional view of an organic light emitting diode display according to an exemplary embodiment. An organic light emitting diode display according to an exemplary embodiment includes a semi-transmissive layer, a first electrode, a first auxiliary layer, an organic emission layer, and a second electrode. The semi-transmissive layer HATL includes a first refractive layer RL1 (500), a second refractive layer RL2 (500), a third refractive layer RL3 (1100), a fourth refractive layer RL4 (700), a fifth refractive layer RL5 (1000), and a sixth refractive layer RL6 (700), the first electrode includes a first light transmissive layer ITO (300) made of ITO, the first auxiliary layer includes a second light transmissive layer ITO (670) made of ITO, the organic emission layer includes a hole injection layer HIL (550), a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 15.

A comparison of the efficiencies of red, green, and blue lights measured for the organic light emitting diode display according to the comparative example and those according to an exemplary embodiment demonstrates that an organic light emitting diode display according to an exemplary embodiment has a lower efficiency of blue light and a higher efficiency of red and green lights. There is an improvement of about 28.4% in terms of color reproduction between the comparative example and the exemplary embodiment of FIG. 14(b).

The exemplary embodiment of FIG. 14(b), which includes the semi-transmissive layer 70, demonstrates improved luminous efficiency and color reproduction. Additionally, the organic light emitting diode display 104 according to the exemplary embodiment of FIG. 14(b) is a bottom emission type, and can thus be used in a large-sized display for improving luminous efficiency and color reproduction of such a device.

Since the organic light emitting diode display 104 according to the exemplary embodiment of FIG. 14(b) includes the semi-transmissive layer 70, the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 104.

An organic light emitting diode display 105 according to an exemplary embodiment will be described with reference to FIG. 16.

Figure 16:
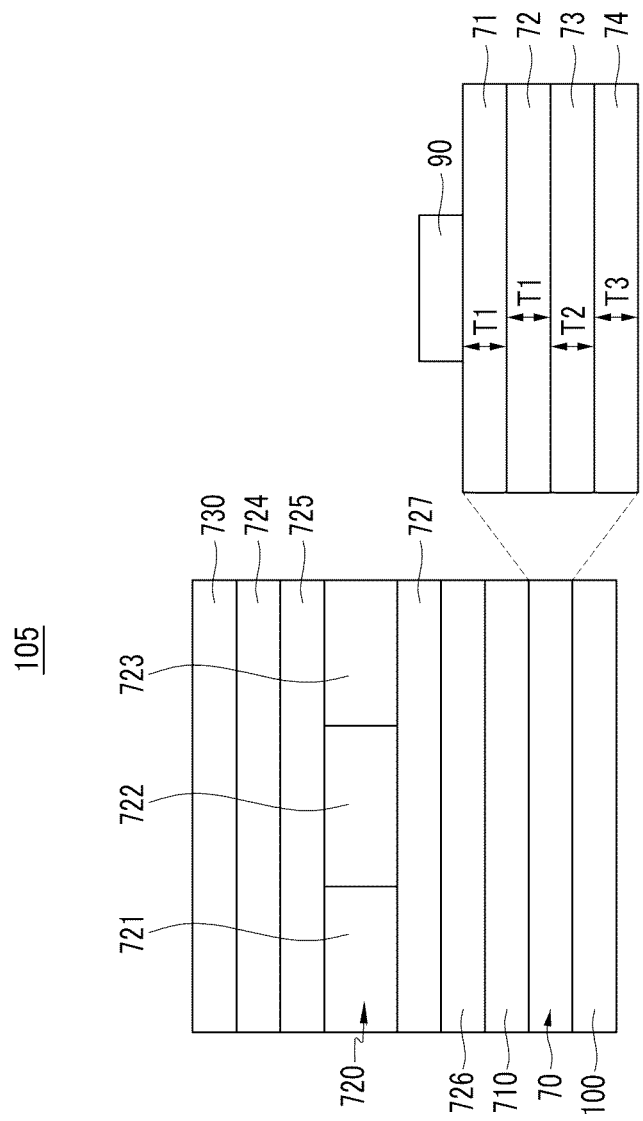
FIG. 16 is a cross-sectional view showing the main components of an organic light emitting diode display according to an exemplary embodiment.

FIG. 16 is a cross-sectional view showing the main parts of an organic light emitting diode display according to an exemplary embodiment.

In the embodiment of FIG. 16, an organic emission layer 720 includes an electron injection layer 724, an electron transport layer 725, a hole injection layer 726, and a hole transport layer 727.

A first auxiliary layer 90 is positioned between a first electrode 710 and a first refractive layer 71. The first auxiliary layer 90 is formed of the same material as a second refractive layer 72, and has a second refractive index. Similar to the second refractive layer 72, the first auxiliary layer 90 refracts the lights emitted from the organic emission layer 720 and transmitted to the first auxiliary layer 71, or the lights reflected by the first refractive layer 71, based on the second refractive index. The first auxiliary layer 90 is positioned between a second main emitting layer 722 and the first refractive layer 71, corresponding to the second main emitting layer 722 so that the second main emitting layer 722 is spaced apart from a first substrate 100 further than a first main emitting layer 721 and a third main emitting layer 723. In some embodiments, the auxiliary layer is integrated in the first electrode.

A semi-transmissive layer 70 includes a first refractive layer 71, a second refractive layer 72, a third refractive layer 73, and a fourth refractive layer 74.

By gradually refracting the lights repeatedly reflected or transmitted between a second electrode 730 and the semi-transmissive layer 70 at different angles, the organic light emitting diode display 105 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 105.

An exemplary embodiment demonstrating the improvement of luminous efficiency and color reproduction of the organic light emitting diode display will be described with reference to FIGS. 17 and 18. The thicknesses of the components to be described below are represented by the numbers in parentheses, and the unit of thickness is Å.

Figure 17:
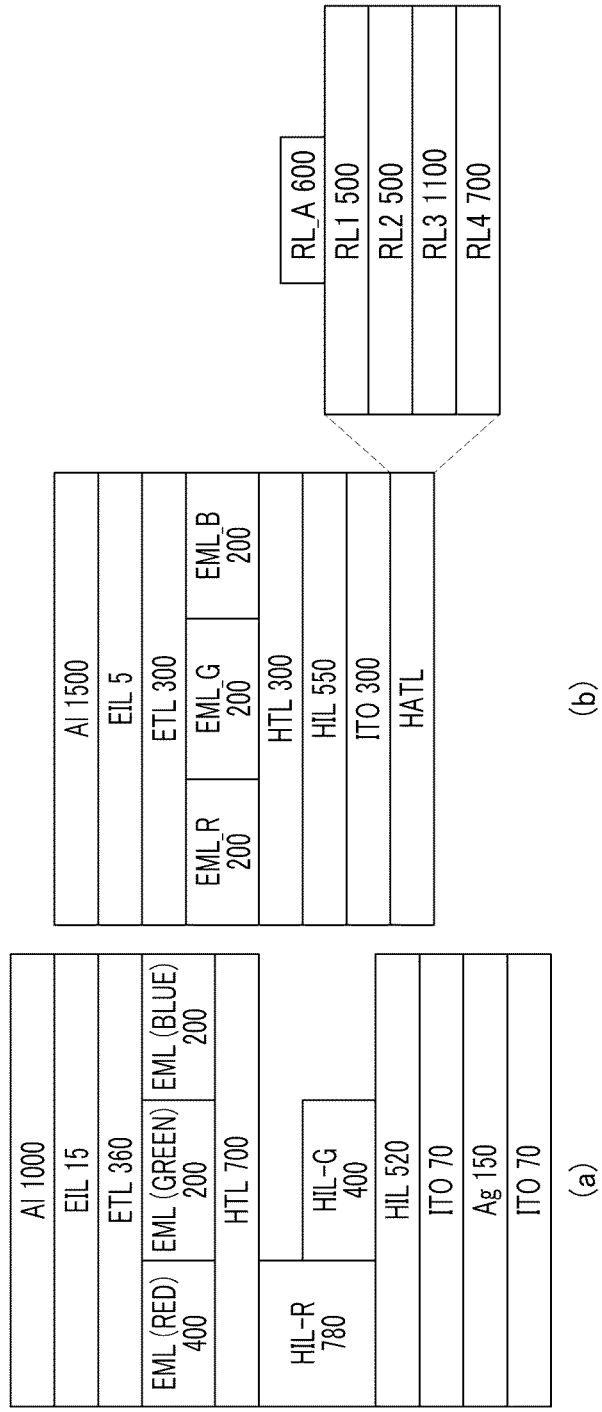
FIG. 17 shows cross-sectional views of the main components of each of organic light emitting diode displays according to an exemplary embodiment and the comparative example.

FIG. 17 shows cross-sectional views of the main components of each of organic light emitting diode displays according to an exemplary embodiment and the comparative example. FIG. 18 is a table showing the color characteristics of light measured for each of the organic light emitting diode displays according to an exemplary embodiment and the comparative example.

FIG. 17(a) shows a cross-sectional view of an organic light emitting diode display according to the comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a third transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 18. The efficiency of red light, green light, and blue light measured for the organic light emitting diode display according to the comparative example is 100%.

FIG. 17(b) shows a cross-sectional view of an organic light emitting diode display according to an exemplary embodiment. An organic light emitting diode display according to an exemplary embodiment includes a semi-transmissive layer, a first auxiliary layer, a first electrode, an organic emission layer, and a second electrode. The semi-transmissive layer HATL includes a first refractive layer RL1 (500), a second refractive layer RL2 (500), a third refractive layer RL3 (1100), and a fourth refractive layer RL4 (700), the first auxiliary layer includes an auxiliary refractive layer RL_A (600), the first electrode includes a first light transmissive layer ITO (300) made of ITO, the organic emission layer includes a hole injection layer HIL (550), a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 18.

A comparison of the efficiencies of red, green, and blue lights measured for the organic light emitting diode display according to the comparative example and those according to an exemplary embodiment demonstrates that an organic light emitting diode display according to an exemplary embodiment has a lower efficiency of blue light and a higher efficiency of red and green lights. There is an improvement of about 19.7% in terms of color reproduction between the comparative example and the exemplary embodiment of FIG. 17(*b*).

The exemplary embodiment of FIG. 17(*b*), which includes the semi-transmissive layer 70, demonstrates improved luminous efficiency and color reproduction. Additionally, the organic light emitting diode display 105 according to the exemplary embodiment of FIG. 17(*b*) is a bottom emission type, and can thus be used in a large-sized display device for improving luminous efficiency and color reproduction of such a device.

Since the organic light emitting diode display 105 according to the exemplary embodiment of FIG. 17(*b*) includes the semi-transmissive layer 70, the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 105.

An organic light emitting diode display 106 according to an exemplary embodiment will be described with reference to FIG. 19.

Figure 19:
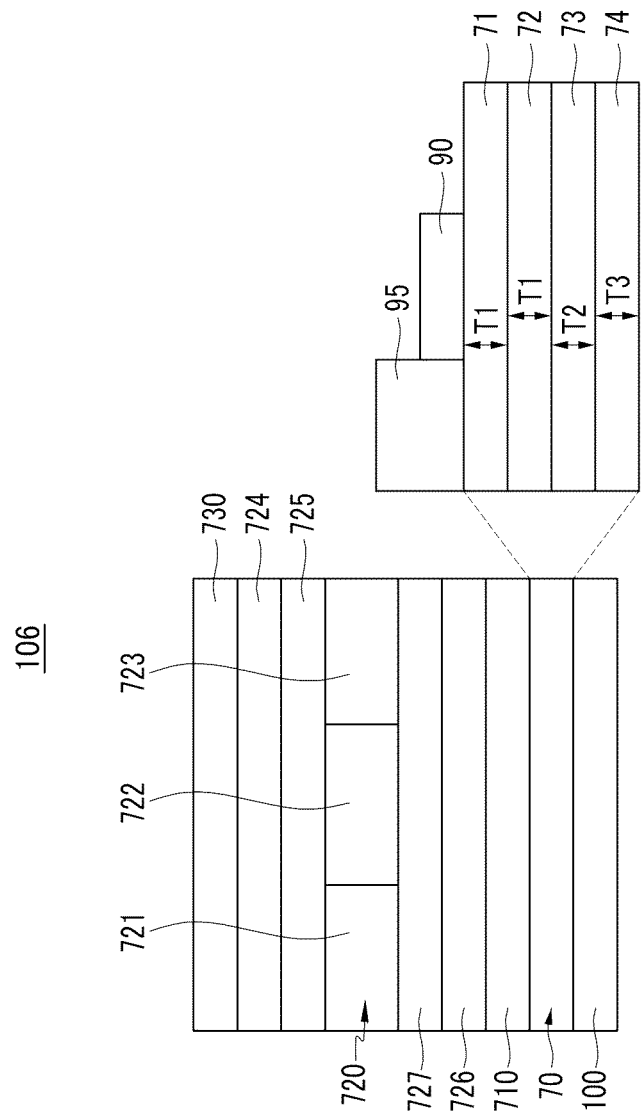
FIG. 19 is a cross-sectional view showing the main components of an organic light emitting diode display according to an exemplary embodiment.

FIG. 19 is a cross-sectional view showing the main components of an organic light emitting diode display according to an exemplary embodiment.

In the embodiment of FIG. 19, an organic emission layer 720 includes an electron injection layer 724, an electron transport layer 725, a hole injection layer 726, and a hole transport layer 727.

A first auxiliary layer 90 is positioned between a first electrode 710 and a first refractive layer 71. The first auxiliary layer 90 is formed of the same material as a second refractive layer 72, and, similar to the second refractive layer 72, refracts the lights emitted from the organic emission layer 720 and transmitted to the first auxiliary layer 71 or the lights reflected by the first refractive layer 71 according to a first refractive index. The first auxiliary layer 90 is positioned between a second main emitting layer 722 and the first refractive layer 71, corresponding to the second main emitting layer 722 so that the second main emitting layer 722 is spaced apart from a first substrate 100 further than a third main emitting layer 723. In some embodiments, the auxiliary layer is integrated in the first electrode.

A second auxiliary layer 95 is positioned between the first electrode 710 and the first refractive layer 71, corresponding to the first main emitting layer 721. The second auxiliary layer 95 is formed of the same material as the second refractive layer 72, and has a second refractive index. Similar to the second refractive layer 72, the second auxiliary layer 95 refracts the lights emitted from the organic emission layer 720 and transmitted to the first auxiliary layer 90 or the lights reflected by the first refractive layer 71 according to the second refractive index. The second auxiliary layer 95 is positioned between the first main emitting layer 721 and the first refractive layer 71, corresponding to the first main emitting layer 721 so that the first main emitting layer 721 is spaced apart from the first substrate 100 further than the second main emitting layer 722 and the third main emitting layer 723. In some embodiments, the second auxiliary layer is integrated in the electrode.

A semi-transmissive layer 70 includes a first refractive layer 71, a second refractive layer 72, a third refractive layer 73, and a fourth refractive layer 74.

By gradually refracting the lights repeatedly reflected or transmitted between a second electrode 730 and the semi-transmissive layer 70 at different angles, the organic light emitting diode display 106 according to an exemplary embodiment causes the lights emitted from the organic emission layer 720 and irradiated to the outside through the first substrate 100 to generate a strong microcavity effect, thus enhancing the luminous efficiency and color reproduction of the organic light emitting diode display 106.

An exemplary embodiment demonstrating improvement of luminous efficiency and color reproduction of the organic light emitting diode display will be described with reference to FIGS. 20 and 21. The thicknesses of the components to be described below are represented by the numbers in parentheses, and the unit of thickness is Å.

Figure 20:
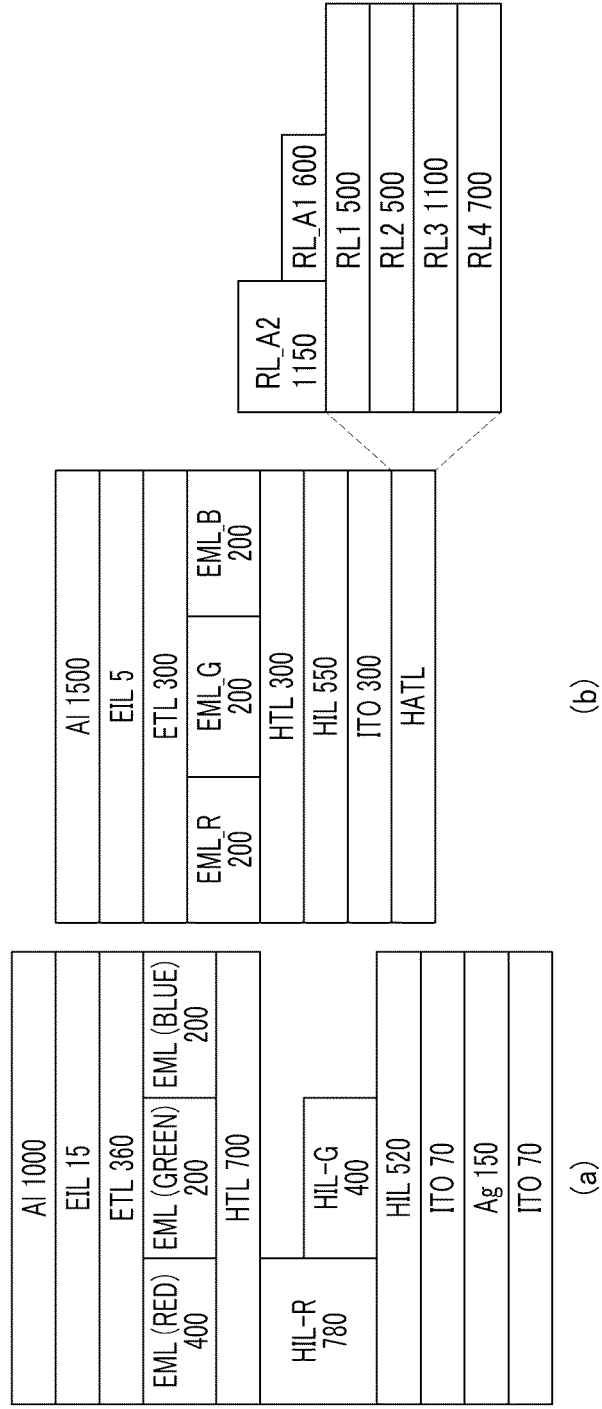
FIG. 20 shows cross-sectional views of the main components of each of organic light emitting diode displays according to an exemplary embodiment and the comparative example.

FIG. 20 shows cross-sectional views of the main components of each of organic light emitting diode displays according to an exemplary embodiment and the comparative example. FIG. 21 is a table showing the color characteristics of light measured for each of the organic light emitting diode displays according to an exemplary embodiment and the comparative example.

FIG. 20(*a*) shows a cross-sectional view of an organic light emitting diode display according to the comparative example. The organic light emitting diode display according to the comparative example includes a first electrode, an organic emission layer, and a second electrode. The first electrode includes a first transmissive layer ITO (70) made of ITO, a semi-transmissive layer Ag (150) made of silver, and a third transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of color characteristics of light for the organic light emitting diode display according to the comparative example are shown in the table of FIG. 21. The efficiency of red light, green light, and blue light measured for the organic light emitting diode display according to the comparative example is 100%.

FIG. 20(b) shows a cross-sectional view of an organic light emitting diode display according to an exemplary embodiment. The organic light emitting diode display according to an exemplary embodiment includes a semi-transmissive layer, a first auxiliary layer, a second auxiliary layer, a first electrode, an organic emission layer, and a second electrode. The semi-transmissive layer HATL includes a first refractive layer RL1 (500), a second refractive layer RL2 (500), a third refractive layer RL3 (1100), and a fourth refractive layer RL4 (700), the first auxiliary layer includes a first auxiliary refractive layer RL_A1 (600), the second auxiliary layer includes a second auxiliary refractive layer RL_A2 (1150), the first electrode includes a first light transmissive layer ITO (300) made of ITO, the organic emission layer includes a hole injection layer HIL (550), a hole transport layer HTL (300), a first main emitting layer EML_R (200), a second main emitting layer EML_G (200), a third main emitting layer EML_B (200), an electron transport layer ETL (300), and an electron injection layer EIL (5), and the second electrode includes a light reflective layer Al (1500) made of aluminum.

Measurements of color characteristics of light for the organic light emitting diode display according to an exemplary embodiment are shown in the table of FIG. 21.

A comparison of the efficiencies of red, green, and blue lights measured for the organic light emitting diode display according to the comparative example and those according to an exemplary embodiment demonstrates that an organic light emitting diode display according to an exemplary embodiment has a lower efficiency of blue light and a higher efficiency of red and green lights. There is an improvement of about 18.9% in terms of color reproduction between the comparative example and the exemplary embodiment of FIG. 20(b).

The exemplary embodiment of FIG. 20(b), which includes the semi-transmissive layer 70, demonstrates improved luminous efficiency and color reproduction. Additionally, the organic light emitting diode display 106 according to the exemplary embodiment is a bottom emission type, and can thus be used in a large-sized display device for improving luminous efficiency and color reproduction in such a device.

Since the organic light emitting diode display 106 according to an exemplary embodiment includes the semi-transmissive layer 70, the thickness of the organic emission layer 720 need not be varied according to the wavelength of light (red, green, or blue light) emitted from the organic emission layer 720, thereby minimizing a deposition process using an additional mask and minimizing the overall manufacturing time and complexity of the organic light emitting diode display 106.

While this disclosure has been described in connection with certain exemplary embodiments, it is to be understood that the invention is not limited to the disclosed embodiments, but, on the contrary, is intended to cover various modifications and equivalent arrangements.

What is claimed is:

1. An organic light emitting diode display, comprising:
   a substrate;
   a first electrode positioned on the substrate, wherein the first electrode is configured to substantially transmit visible light therethrough;
   an organic emission layer positioned on the first electrode;
   a second electrode positioned on the organic emission layer, wherein the second electrode is configured to substantially reflect visible light; and
   a semi-transmissive layer positioned between the substrate and the first electrode, wherein the semi-transmissive layer comprises a plurality of refractive sub-layers, wherein two abutting ones of the plurality of sub-layers have different refractive indices and wherein the plurality of sub-layers comprises a first refractive sub-layer positioned between the substrate and the first electrode and having a first refractive sub-index, and a second refractive sub-layer positioned between the first refractive sub-layer and the substrate, the second refractive sub-layer having a second refractive index that is greater than the first refractive index, wherein the thickness of the first refractive sub-layer and the thickness of the second refractive sub-layer are about the same.

2. The organic light emitting diode device of claim 1, wherein the plurality of refractive sub-layers each comprise an insulating material containing at least one of silicon oxide ($SiO_2$), silicon nitride ($SiN_x$), niobium oxide ($Nb_2O_5$), and titanium oxide ($TiO_2$).

3. The organic light emitting diode display of claim 1, wherein
   the plurality of refractive sub-layers further comprises:
   a third refractive sub-layer positioned between the second refractive sub-layer and the substrate, having a third refractive index that is about the same as the first refractive index; and
   a fourth refractive sub-layer positioned between the third refractive sub-layer and the substrate, having a fourth refractive index that is about the same as the second refractive index.

4. The organic light emitting diode display of claim 3, wherein the thickness of the third refractive sub-layer is greater than the thickness of the first refractive sub-layer.

5. The organic light emitting diode display of claim 4, wherein the thickness of the fourth refractive sub-layer is greater than the thickness of the second refractive sub-layer.

6. The organic light emitting diode display of claim 5, wherein
   the first refractive index is about 1.5, and
   the second refractive index is about 1.9.

7. The organic light emitting diode display of claim 3, wherein
   the plurality of refractive sub-layers further comprises:
   a fifth refractive sub-layer positioned between the fourth refractive sub-layer and the substrate, having a fifth refractive index that is about the same as the first refractive index; and
   a sixth refractive sub-layer positioned between the fifth refractive sub-layer and the substrate, having a sixth refractive index that is about the same as the second refractive index.

8. The organic light emitting diode display of claim 7, wherein
   the thickness of the fifth refractive sub-layer is about the same as the thickness of the third refractive sub-layer, and
   the thickness of the sixth refractive sub-layer is about the same as the thickness of the fourth refractive sub-layer.

9. The organic light emitting diode display of claim 1, wherein
   the organic emission layer comprises a first main emitting layer for emitting red light, a second main emitting layer for emitting green light, a third main emitting layer for emitting blue light, and a first auxiliary layer positioned between the second main emitting layer and the substrate, wherein the second main emitting layer is spaced apart from the substrate further than the first and third main emitting layers.

10. The organic light emitting diode display of claim 9, wherein
the first electrode is configured to be an anode, and
the first auxiliary layer is positioned between the second main emitting layer and the first electrode, wherein the auxiliary layer is configured to permit holes injected from the first electrode to the second main emitting layer to pass.

11. The organic light emitting diode display of claim 9, wherein the first auxiliary layer is positioned between the organic emission layer and the first electrode, and is formed of substantially the same material as the first electrode.

12. The organic light emitting diode display of claim 9, wherein the first auxiliary layer is positioned between the first electrode and the first refractive sub-layer.

13. The organic light emitting diode display of claim 12, wherein the first auxiliary layer has a refractive index that is about the same as the second refractive index.

14. The organic light emitting diode display of claim 12, wherein the organic emission layer further comprises a second auxiliary layer positioned between the first electrode and the first refractive sub-layer, such that the first main emitting layer is spaced apart from the substrate further than the second and third main emitting layers.

15. The organic light emitting diode display of claim 14, wherein the first auxiliary layer and the second auxiliary layer have refractive indices which are about the same as the second refractive index.

16. An organic light emitting diode display, comprising:
a first substrate;
a first electrode positioned over the first substrate and configured to substantially transmit visible light therethrough;
a semi-transmissive layer positioned between the first substrate and the first electrode, wherein the semi-transmissive layer comprises a plurality of refractive sub-layers, wherein each refractive sub-layer has a refractive index different than the refractive index of abutting sub-layers, wherein the refractive sub-layers are each configured to at least partially reflect and to at least partially transmit light incident to the each refractive sub-layer and wherein the plurality of sub-layers comprises a first refractive sub-layer positioned between the substrate and the first electrode and having a first refractive sub-index, and a second refractive sub-layer positioned between the first refractive sub-layer and the substrate, the second refractive sub-layer having a second refractive index that is greater than the first refractive index, wherein the thickness of the first refractive sub-layer and the thickness of the second refractive sub-layer are about the same;
an organic emission layer positioned over the first electrode, wherein the organic emission layer comprises first, second and third emitting sub-layers, wherein the emitting sub-layers are laterally placed with one another, and at least one auxiliary layer positioned between the first electrode and at least one of the emitting sub-layers such that at least one of the emitting sub-layers is spaced further away from the first electrode than the other emitting sub-layers, and wherein the at least one auxiliary layer is formed of the same material as the first electrode; and
a second electrode positioned over the organic emission layer, configured to substantially reflect visible light.

17. The organic light emitting diode display of claim 16, wherein the display is configured to permit light beams emitted from the organic emission layer to be refracted at different angles by the plurality of refractive sub-layers, thereby mutually reinforcing the light beams.

18. The organic light emitting diode display of claim 16, wherein at least two consecutive ones of the plurality of refractive sub-layers are repeated at least once within the refractive layer.

* * * * *